United States Patent
Ou-Yang et al.

(10) Patent No.: US 6,379,574 B1
(45) Date of Patent: Apr. 30, 2002

(54) INTEGRATED POST-ETCH TREATMENT FOR A DIELECTRIC ETCH PROCESS

(75) Inventors: Hui Ou-Yang, Hsin-Chen; Chih-Ping Yang, Taichung, both of (TW); Lin Ye, Vallejo; Robert W. Wu, Pleasanton, both of CA (US); Chih-Pang Chen, Yong He; You-Neng Cheng, Taipei, both of (TW); Yang Chan-Lon, Los Gatos, CA (US); Tong-Yu Chen, Hsin-Chu (TW)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/320,251

(22) Filed: May 26, 1999

Related U.S. Application Data

(63) Continuation-in-part of application No. 09/304,449, filed on May 3, 1999.

(51) Int. Cl.[7] ................................................. B44C 1/22
(52) U.S. Cl. .............................. 216/49; 216/67; 216/79; 438/714; 438/717; 438/724; 438/725; 134/1.2; 134/21
(58) Field of Search ............................. 216/49, 67, 79; 438/714, 717, 724, 725; 134/1.2, 21

(56) References Cited

U.S. PATENT DOCUMENTS

| | | | | |
|---|---|---|---|---|
| 4,484,979 A | * | 11/1984 | Stocker ....................... | 156/643 |
| 5,721,090 A | * | 2/1998 | Okamoto et al. ............ | 430/313 |
| 5,786,276 A | * | 7/1998 | Brooks et al. ............... | 438/724 |
| 6,008,139 A | * | 12/1999 | Graff et al. .................. | 438/700 |
| 6,080,662 A | * | 6/2000 | Chen et al. .................. | 438/637 |
| 6,082,374 A | * | 7/2000 | Huffman et al. ............. | 134/1.1 |
| 6,207,583 B1 | * | 3/2001 | Dunne et al. ................ | 437/725 |
| 6,238,588 B1 | | 5/2001 | Collins et al. ................ | 216/68 |

OTHER PUBLICATIONS

U.S. application No. 09/183,778, of Kenneth S. Collins et al., filed Oct. 30, 1998.
U.S. application No. 09/304,449, of Ou-Yang et al., filed May 3, 1999.

* cited by examiner

Primary Examiner—Randy Gulakowski
Assistant Examiner—Allan Olsen
(74) Attorney, Agent, or Firm—Shirley Church; Kathi Bean; Joseph Bach

(57) ABSTRACT

The present disclosure pertains to an integrated post-etch treatment method which is performed after a dielectric etch process. Using the method of the invention, byproducts formed on the sidewalls of contact vias during the dielectric etch process can be removed efficiently. The method of the invention also reduces or eliminates the problem of polymer accumulation on process chamber surfaces. An overlying photoresist layer and anti-reflection layer are removed during the performance of the post-etch treatment method. Typically, after the etch of a dielectric material to define pattern or interconnect filling spaces, a series of post-etch treatment steps is performed to remove residues remaining on the wafer after the dielectric etch process. According to the method of the present invention, a post-etch treatment method including one or more steps is performed after the dielectric etch process, preferably within the same processing chamber in which the dielectric etch process was performed. The post-etch treatment method comprises exposing a semiconductor structure to a plasma generated from a source gas comprising oxygen, a nitrogen-comprising gas, and a reactive gas comprising hydrogen, carbon, and fluorine. Two optional steps, a flushing step prior to the post-etch treatment and a cleaning step subsequent to the post-etch treatment, can be performed for the purpose of enhancing the fluorine and byproduct removal and post-etch chamber cleaning.

24 Claims, 4 Drawing Sheets

INTEGRATED POST-ETCH TREATMENT FOR A DIELECTRIC ETCH PROCESS

The present application is a continuation-in-part of U.S. application Ser. No. 09/304,449, filed May 3, 1999.

BACKGROUND OF THE INVENTION

1. Field of the Invention

The present invention pertains to a semiconductor manufacturing process. In particular, the present invention pertains to an integrated post-etch treatment method which is performed after etching of a dielectric surface, for the purpose of removing photoresist, byproducts remaining on the dielectric surface after the etch process, and for removing an anti-reflection (ARC) layer underlying the dielectric layer.

2. Brief Description of the Background Art

Since the development of the first integrated circuit device, the technology of semiconductor fabrication has focused on minimizing the feature size of semiconductor devices. With the advancements made in processing technologies such as deposition, lithography, etching, and thermal treatment, the packing density of integrated circuit chips has greatly increased. A single chip manufactured using the present semiconductor fabrication technology may include millions or even billions of devices such as transistors and capacitors. Therefore, the feature size of integrated circuit devices has been scaled down to a submicron level in order to attain the high packing density of fabricated chips.

On a single integrated circuit chip, various devices are connected through conductive interconnections. Generally, several layers of conductive structures with horizontal and vertical wirings are applied to a substrate to form the designed circuit connections. The conductive layers are insulated from each other using dielectric materials. A wiring layer of interconnections is typically composed primarily of a dielectric layer with the defined horizontal wiring members and downward-extended, vertical wiring members, often referred to as "plugs".

Using the present metallization technology for forming interconnections, a dielectric layer is first formed on a substrate, then defined with openings in order to provides spaces for depositing conductive materials, which will connect with the underlying substrate. The conductive materials are deposited into openings, typically referred to as "contact vias", to form the vertical wirings. After a wiring pattern has been defined on the conductive layer, the horizontal wirings can be formed by depositing another conductive layer. When dual damascene technology is used, the horizontal wirings can be defined within the dielectric layer, such that the vertical and horizontal wirings can be formed simultaneously when the conductive materials are deposited into the vertical contact vias and horizontal channels which were previously defined in the dielectric layer.

Referring to FIG. 1, which shows a typical structure of the kind known in the art, an interconnection layer 12 is formed on a semiconductor substrate 10, and an anti-reflection layer (ARC) 14 is formed on the interconnection layer 12 for the purpose of improving the pattern-defining accuracy and resolution. The ARC layer 14 typically comprises a material such as titanium nitride. A dielectric layer 16 overlies the interconnection layer 12 and the ARC layer 14. To define the necessary openings for making vertical connecting plugs, a photoresist layer 18 is formed over the dielectric layer 16, with the designed pattern exposed and developed. The dielectric layer 16 is then etched using the photoresist layer 18 as a mask in order to define interlayer contact vias 20, as shown in FIG. 2. Generally, some residues may remain and some byproducts may be created during the etch process, such as the polymer 22 formed on the sidewall of the contact vias 20, as well as on the surrounding walls of the processing chamber. With the presence of the underlying interconnection layer 12 and ARC layer 14 in some of the etched regions, the deposited polymer 22 may contain metallic ions or molecules.

After the main etch step for defining the contact vias is completed, a series of processes are carried out to remove the remaining photoresist 18 and deposited residues and/or byproducts 22. This series of processes or process steps is frequently referred to as contact via definition finishing. The ARC layer 14 underlying the base of the contact via 20 is also typically removed in order to improve contact conductivity. In the conventional fabrication process, the etch process for finishing contact via definition typically includes three post-etch treatment steps, as shown in FIG. 4. After the main etch 30 is performed, a first phase post-etch treatment (PET) 32 is performed comprising a single step or a sequence of sub-steps to remove the photoresist 18 and residues or byproducts such as the deposited polymer 22. Then, a second etch step for removal of residual ARC layer 14 is carried out. Finally, in order to stabilize chamber conditions, a second phase post-etch treatment 36 is performed to clean the residue remaining on the substrate 10 and the processing chamber walls after the ARC layer etch step 34.

An earlier approach for post-etch treatment is described in copending U.S. application Ser. No. 09/183,778, filed Oct. 30, 1998, and titled: "Method Of Reducing Stop Layer Loss In A Photoresist Stripping Process Using Hydrogen As a Fluorine Scavenger". The application Ser. No. 09/183,778 is assigned to the assignee of the present invention and is hereby incorporated by reference in its entirety. In the earlier approach, the first phase post-etch treatment 32 typically includes three steps which comprise exposing the substrate to a high-flow oxygen plasma, followed by a low-flow oxygen plasma, followed by a cleaning step. However, this method has some disadvantages. For example, in the first phase of the post-etch treatment, the oxygen plasma has been found to be ineffective and inefficient at removing the deposited polymer 22, particularly the metal-comprising polymer generated during the main etch step 30. The presence of such residual metal-comprising polymer in the contact vias damages the contact between subsequently deposited conductive materials and the underlying interconnection layer 12. The accumulation of metal comprising polymer potentially interferes with the maintenance of a stable and predictable process chamber condition. The controllability of the process is reduced under unstable chamber conditions, resulting in degraded process windows and product yields. Furthermore, the traditional oxygen plasma treatment attacks the sidewalls of dielectric layer 16, altering the shape of the contact via 20.

During the anti-reflection etch 34 to remove the anti-reflection layer 14 (such as titanium nitride), the selectivity of etching the anti-reflection layer 14 relative to the dielectric layer 16 and the underlying aluminum interconnection material 12 may be poor, resulting in severe dielectric loss and/or aluminum sputtering. FIG. 3 illustrates the kind of sputtering of an underlying aluminum interconnection layer 12 which frequently occurs during the anti-reflection etch step 34. The multi-step post-etch process following the main etch 30 also increases the processing time and significantly reduces the wafer throughput of the contact via etch process.

SUMMARY OF THE INVENTION

The present invention pertains to an integrated post-etch treatment method which is performed after a dielectric etch process for the purpose of removing residual photoresist and byproducts remaining after the etch process. Through the process and chemistry of the present invention, the contact vias formed by etching a dielectric layer can be provided with an improved sidewall profile, and the process chamber conditions can be easily maintained, with less undesired residues and reduced polymer byproduct build-up both on contact via sidewalls and process chamber surfaces. The integrated post-etch treatment method of the present invention further removes an anti-reflection layer overlying an interconnection layer using fewer process steps than are used in conventional approaches.

According to the present invention, after the etch of dielectric material to define a pattern or spaces for filling, such as contact vias or interconnection channels, at least one post-etch treatment step is performed to remove residues remaining on the etched semiconductor structure surface. When an oxygen-containing and/or metal-containing ARC layer is present, this post-etch treatment step may also be used to remove an underlying ARC layer in applications such as the formation of interconnection layer plugs. Preferably, this treatment is performed in the same processing chamber as the dielectric etch. Preferably, the post-etch treatment step removes residual photoresist, while the residues and polymer deposits on the walls of the contact via are removed.

According to the method of the present invention, following the dielectric etch process, the semiconductor structure is exposed to a post-etch treatment step in which the structure is contacted with a plasma generated from a source gas comprising oxygen, a nitrogen-comprising gas, and a reactive gas comprising hydrogen, carbon, and fluorine. With the addition of the nitrogen-comprising gas and the reactive gas to an oxygen-containing plasma source gas, the etchant species generated effectively remove residues and polymers remaining in contact vias after dielectric etch.

The reactive gas preferably comprises at least one hydrogen-containing fluorocarbon gas, which is preferably selected from the group consisting of $CHF_3$, $CH_2F_2$, $CH_3F$, $C_3H_2F_6$, and combinations thereof. Alternatively, the reactive gas comprises at least one fluorocarbon gas and hydrogen. The fluorocarbon gas is preferably selected from the group consisting of $C_2F_6$, $C_3F_6$, $C_3F_8$, $C_4F_6$, $C_4F_8$, and combinations thereof.

The nitrogen-comprising gas is preferably $N_2$. The addition of nitrogen improves the dissociation of oxygen and other gas species and also enhances residue removal.

Using the method of the invention, the exposed portion of an oxygen-containing and/or metal-containing ARC layer overlying the interconnection layer may be removed, for the purpose of improving the conductivity of the interconnection layer. Using the method of the invention, the residual sidewall polymer, and in particular any metal-comprising polymer remaining after the dielectric etch process, can be cleanly removed.

An especially preferred embodiment method of the invention includes two additional steps: a flushing step, performed prior to the post-etch treatment step previously described, and a cleaning step, performed following the post-etch treatment step. The flushing step employs a high-flow oxygen-based plasma for the purpose of flushing out fluorine species which may remain in the chamber after the dielectric etch process. The cleaning step employs a medium-flow oxygen-based plasma which cleans the process chamber and provides a stabilized chamber condition free of undesired residual gases for subsequent processes. This latter cleaning step may alternatively be performed after removal of the semiconductor substrate from the process chamber.

DETAILED DESCRIPTION OF THE PREFERRED EMBODIMENTS

The present invention is an integrated post-etch treatment method for a semiconductor structure following a dielectric etch process. The post-etch treatment method comprises exposing the semiconductor structure to a plasma generated from a source gas comprising oxygen, a nitrogen-comprising gas, and a reactive gas comprising hydrogen, carbon, and fluorine. Sidewall byproducts, such as polymer and/or metal-comprising polymer generated during the dielectric etch, can be removed efficiently using the present method and process chamber surface accumulation of such polymers can be reduced or avoided. The chamber condition can be maintained with improved stability and controllability. The post-etch treatment method of the present invention, which can be effectively used to remove an anti-reflection layer, also reduces or eliminates the prior art problems of aluminum sputtering, oxide loss, and contact via sidewall striation during the post-etch treatment. The integrated post-etch treatment method of the present invention includes fewer processing steps and requires a shorter processing time than conventional multi-step post-etch treatment methods, leading to increased wafer throughput.

I. An Apparatus for Practicing the Invention

Figure 9:
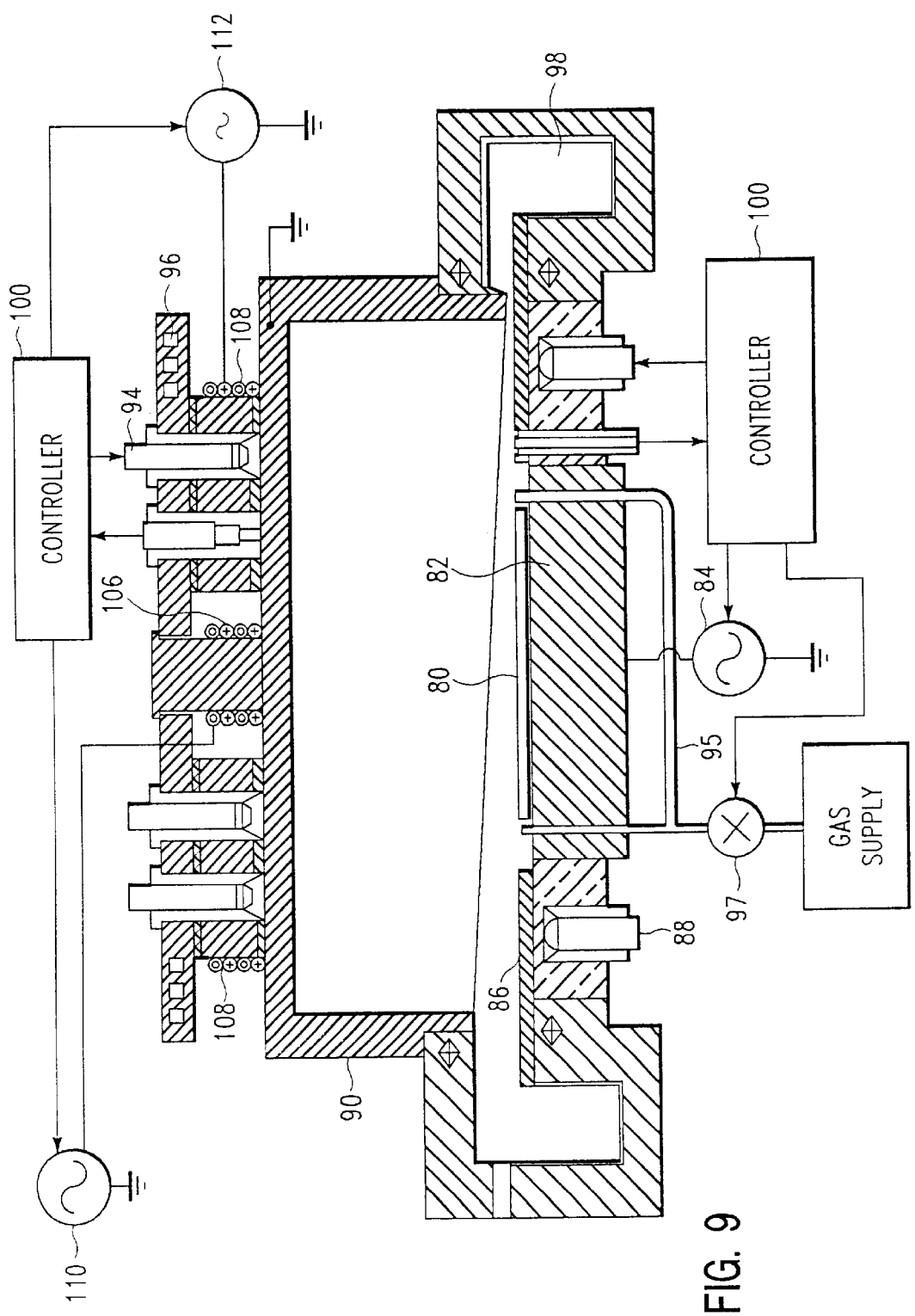
FIG. 9 is a schematic illustration, partially in cross-sectional view, of an inductively coupled high density plasma reactor which is suitable for use in the practice of the present invention.

FIG. 9 is a schematic illustrating an inductively coupled high density plasma reactor which is suitable for use in the practice of the present invention. The particular reactor shown in FIG. 9 is the IPS (inductive plasma source) oxide etch reactor available from Applied Materials, Inc., of Santa Clara, Calif., and described by Collins et al. in U.S. patent application, Ser. No. 09/733,544, filed Oct. 21, 1996.

The general reactor structure and particular auxiliary equipment are illustrated in the schematic which is shown in partial cross-section in FIG. 9. A semiconductor substrate 80 to be processed is supported on a cathode pedestal 82, which is supplied with RF power from a first RF power supply 84. A silicon ring 86 surrounds the pedestal 82 and is controllably heated by an array of heater lamps 88. A chamber 90, including a roof and wall of silicon or other silicon-comprising material, such as silicon carbide, surrounds the plasma processing area. A silicon roof 92 overlies the plasma processing area. Lamps 94 and water cooling channels 96 control the temperature of the silicon roof 92. The temperature-controlled silicon ring 86 is used to scavenge fluorine from a fluorocarbon or other fluorine-based plasma. The silicon (or silicon-comprising) chamber 90 may also be used to scavenge fluorine, but this is less preferred. A processing gas is supplied from one or more bottom gas feeds 95 through a bank of mass flow controllers 97. Alternatively, a top gas feed may be formed as a small showerhead in the center of the silicon roof 92. A vacuum pumping system (not shown) connected to a pumping channel 98 around the lower portion of the chamber maintains the interior of the chamber at a preselected pressure. A system controller 100 controls the operation of the reactor and its auxiliary equipment.

In the apparatus configuration used during the development of the method of the present invention, the material used in the roof portion of chamber 90 was doped to provide a pre-selected level of resistivity. The resistivity level and thickness of the roof portion of chamber 90 was selected to enable the roof to pass RF magnetic fields while simultaneously functioning as an electrode. In the apparatus shown in FIG. 9, the RF magnetic fields were generally axial and were produced by an inner inductive coil stack 106 and an outer inductive coil stack 108 powered by respective RF power supplies 110, 112. Alternatively, a single RF power supply may be used in conjunction with a selectable power splitter. In addition, pedestal 82 was powered by RF power supply 84 so that pedestal 82 could work in conjunction with grounded roof 92 to provide the desired plasma behavioral characteristics. Other coil configurations are possible, such as, for example, the TCP (transformer coupled plasma) reactor, which has a flat, spiral inductive coil overlying the roof 92.

The system controller 100 controls the mass flow controllers 97, the heater lamps 88, 94, the supply of chilled water to the cooling channels 96, the throttle valve to the vacuum pumps (not shown), and the power supplies 84, 110, 112. All of these regulated functions control the etch chemistry in conformance with a particular process recipe. The process recipe is stored in the controller 100 in magnetic, optical, or semiconductor memory, as known in the art, and the controller 100 reads the recipe from a recording medium inserted into the controller. It is typical for the equipment supplier to provide recipes on magnetic media, such as floppy disks, or optical media, such as CDROMs, which are then read into controller 100.

A principal advantage of the inductively coupled plasma reactor shown in FIG. 9 is that controllably different amounts of power can be supplied to the inductive coils 106, 108 and to the capacitive pedestal 82.

II. The Process for Post-etch Treatment Following a Dielectric Etch Process

Figure 6:
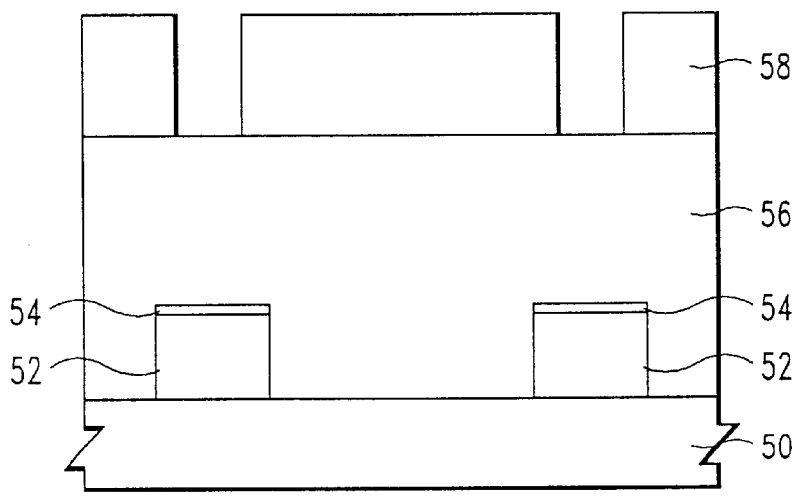
FIG. 6 is a cross-sectional view of a beginning semiconductor structure for performing the method of the invention. The structure includes the following layers, from top to bottom: photoresist masking layer 58; dielectric layer 56; anti-reflective material (e.g., titanium nitride) layer 54; conductive material (e.g., aluminum) layer 52; and semiconductor substrate 50.

FIG. 6 is a cross-sectional view of a beginning semiconductor structure for performing the method of the invention. The structure includes the following layers, from top to bottom: photoresist masking layer 58; dielectric layer 56; anti-reflective material (e.g., titanium nitride) layer 54; conductive material (e.g., aluminum) layer 52; and semiconductor substrate 50.

Figure 7:
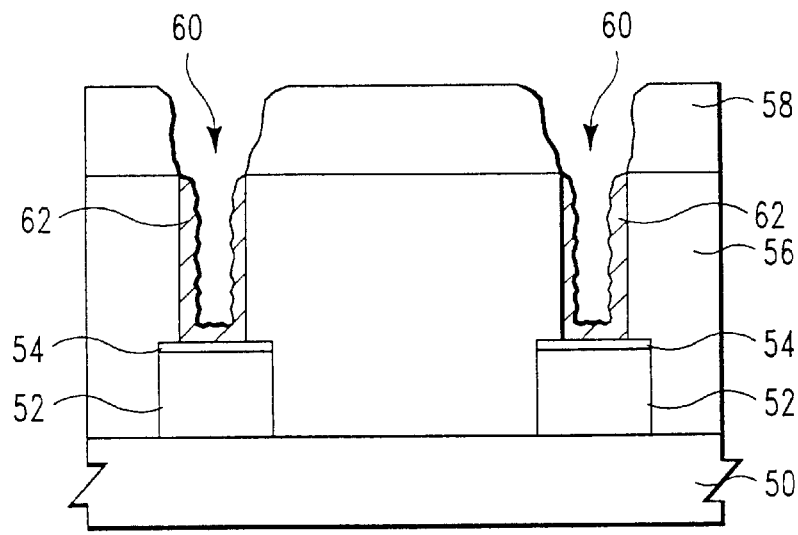
FIG. 7 is a cross-sectional view of the structure shown in FIG. 6, illustrating the build-up of etch byproducts 62 on the sidewalls of etched contact vias 60.

Referring to FIGS. 6 and 7, a dielectric etch process (main etch step) is performed, according to methods known in the art, using a patterned photoresist mask 58 to pattern a dielectric layer 56 which is formed on a semiconductor substrate 50 and which overlies an underlying structure which includes an interconnection layer 52 and an anti-reflection layer 54 overlying the substrate 50. The dielectric layer 56 is etched to form openings 60, to provide connecting holes, typically contact vias, which are subsequently filled with conductive materials. The dielectric layer 56 typically comprises a silicon-based oxide layer such as silicon dioxide or borophosphosilicate glass (BPSG). The interconnection layer 52 typically comprises a conductive material, such as polysilicon or a metal, such as aluminum or an aluminum alloy (e.g., aluminum-copper or aluminum-silicon-copper). An anti-reflection layer 54, comprising, for example, titanium nitride or silicon oxynitride, is typically formed to overlie the interconnection layer 52 for the purpose of improving the pattern-defining accuracy and resolution of the conductive material.

The dielectric etch process is typically performed, using techniques known in the art, in a plasma processing chamber using a fluorine-based plasma to etch contact vias 60 in the dielectric layer 56, as illustrated in FIG. 7. As previously described, some residues may remain and some byproducts may be created during the dielectric etch process, such as the polymer and/or metal-comprising polymer 62 formed on the sidewall of the via holes 60, as well as on the surrounding walls of the processing chamber.

The dielectric etch process is preferably performed using an inductively coupled high density plasma (HDP) etch reactor, an example of which is described above and illustrated in FIG. 9. As used herein, the term "high density plasma" refers to a plasma having an ionization density of at least $10^{11}$ $e^-/cm^3$. The reactor shown in FIG. 9 provides both selectivity and the process flexibility, which are beneficial during a dielectric etch process. Such a reactor can also be advantageously used in the performance of the post-etch treatment method of the following invention. Other types of reactors, including remote plasma source (RPS) reactors, electroncyclotron resonance (ECR) reactors, and capacitively coupled parallel plate reactors of the kind well known in the art may also be used for the dielectric etch process and the post-etch treatment method.

Figure 1:
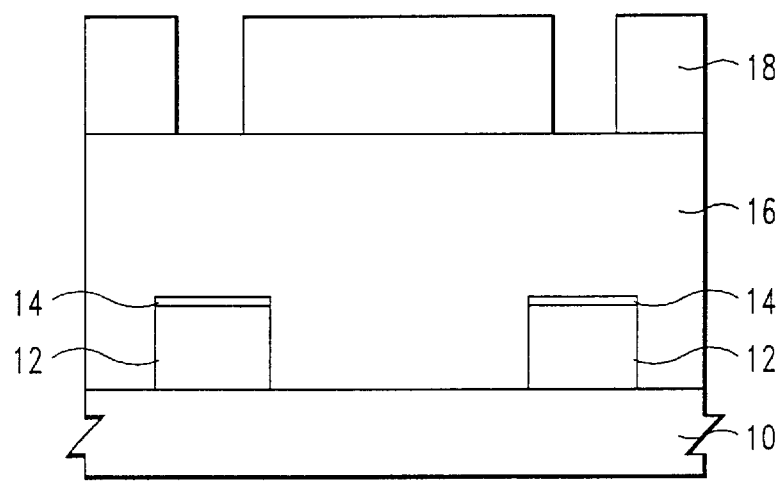
FIG. 1 is a cross-sectional view of a prior art semiconductor structure, including the following layers, from top to bottom: photoresist masking layer 18; dielectric layer 16; anti-reflective material (e.g., titanium nitride) layer 14; conductive material (e.g., aluminum) layer 12; and semiconductor substrate 10.
Figure 2:
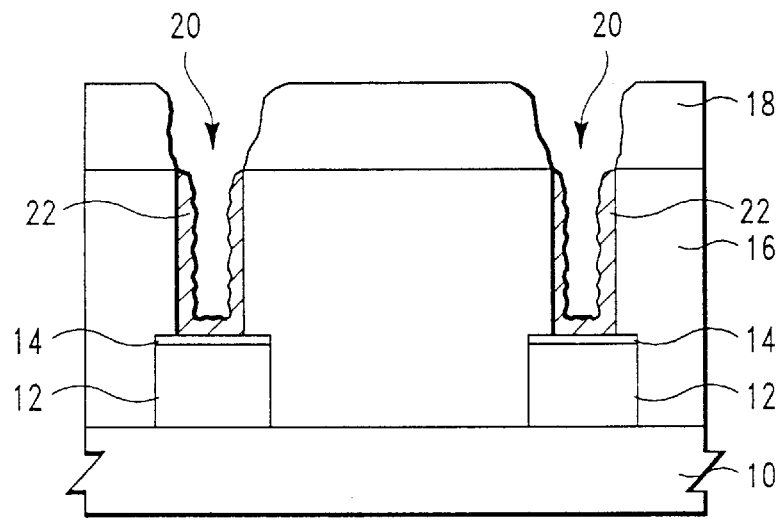
FIG. 2 is a cross-sectional view of the structure shown in FIG. 1, illustrating the build-up of etch byproducts 22 on the sidewalls of etched contact vias 20.
Figure 3:
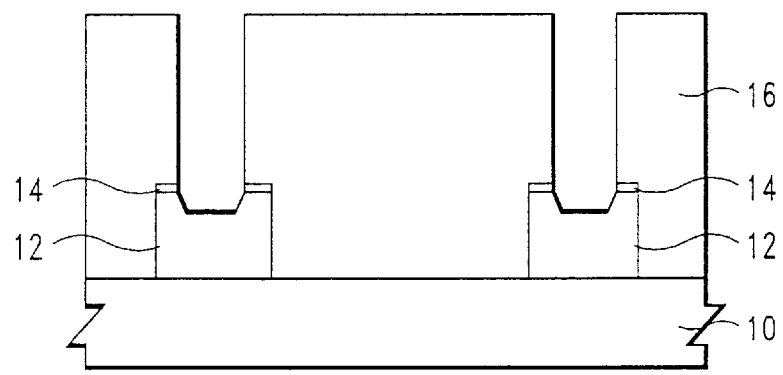
FIG. 3 is a cross-sectional view of the structure shown in FIG. 2, illustrating the sputtering of an underlying aluminum layer 12 during a prior art anti-reflection layer etch process.
Figure 4:
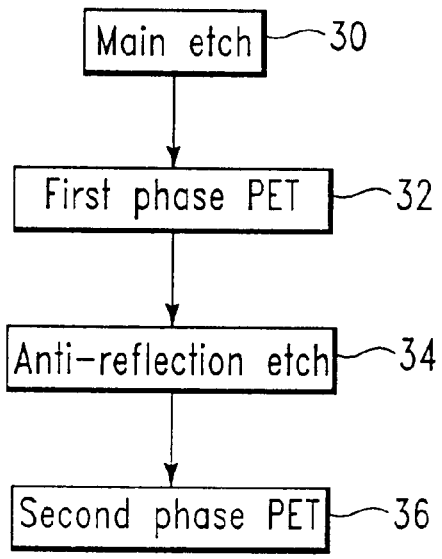
FIG. 4 is a process flow diagram of a prior art process for post-etch treatment following a dielectric etch process.
Figure 5:
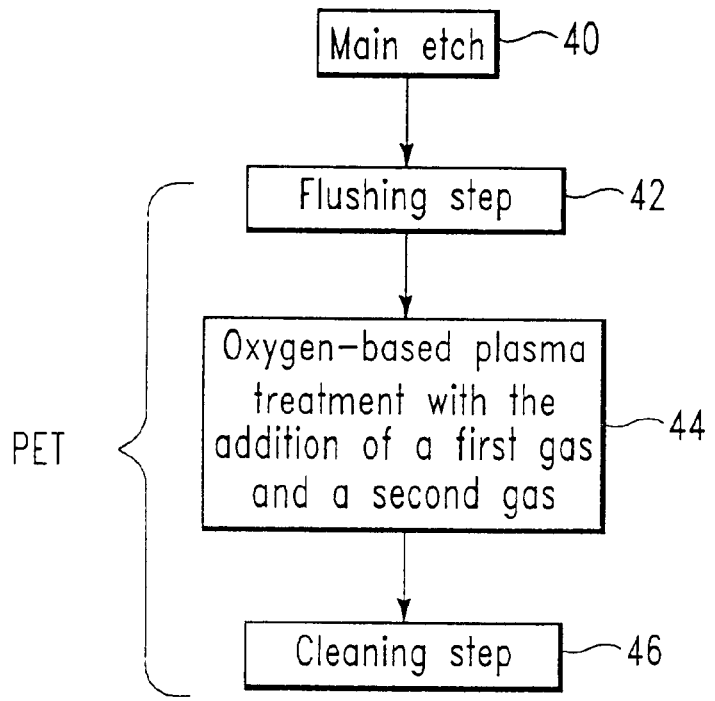
FIG. 5 is a process flow diagram of one embodiment of the present invention.

Referring to FIG. 5, after performance of the dielectric etch process 40, a post-etch treatment method including a single step treatment 44 or a sequence of steps 42 through 44 is then performed. The post-etch treatment method is preferably performed in the same processing chamber as the dielectric etch process.

In one preferred embodiment of the method of the invention, a flushing step 42 is performed after the dielectric etch process 40 and prior to the post-etch treatment step 44 in order to flush out fluorine species remaining in the chamber after the dielectric etch process 40. The flushing step 42 is preferably performed in the same processing chamber as the dielectric etch process 40. The flushing step 42 is performed using a high-flow oxygen-based plasma. When an inductively coupled high density plasma etch reactor is used, the flow rate of oxygen during this step is typically within the range of about 750 sccm and about 1250 sccm, most preferably, about 1000 sccm. The source power is typically within the range of about 2500 W and about 3500 W, most preferably, about 3000 W.

In a particularly preferred embodiment of the invention, when the Applied Materials' IPS oxide etch reactor illustrated in FIG. 9 is used, the flushing step 42 of high-flow oxygen-based plasma is performed using an inner ring source power within the range of about 500 W and about 1000 W, most preferably, about 750 W, and an outer ring source power within the range of about 2000 W and about 2500 W, most preferably, about 2250 W. No bias power is typically applied during the flushing step. As described above, the inner ring source power is the RF power supplied to the inner inductive coil stack 106, and the outer ring source power is the RF power supplied to the outer inductive coil stack 108.

The flushing step 42 flushes fluorine species which remain in the processing chamber after the dielectric etch process 40 out of the chamber using a high-flow oxygen-based plasma. Alternatively, oxygen-comprising gases can be used to form or added to the oxygen-based plasma. The photoresist layer 58 can be totally, or at least partially, removed during the flushing step 42. During the flushing step 42, the process chamber pressure can vary greatly with the release of fluorine species. The process chamber pressure typically ranges between about 30 mTorr and about 120 mTorr.

Next, a post-etch treatment step is performed comprising exposing the semiconductor structure to a plasma generated from a source gas comprising oxygen, a nitrogen-comprising gas, and a reactive gas comprising hydrogen, carbon, and fluorine. With the addition of the nitrogen-comprising gas and the reactive gas, the oxygen-based plasma effectively removes residues and polymers 62 which remain in contact vias 60 after dielectric etch, as shown in FIG. 7.

When an inductively coupled high density plasma etch reactor is used, the flow rate of oxygen during this step is typically within the range of about 50 sccm and about 200 sccm, most preferably, about 100 sccm. Other oxygen-comprising gases can be utilized or added to the oxygen-based plasma.

The reactive gas comprises at least one hydrogen-containing fluorocarbon gas, preferably selected from the group consisting of $CHF_3$, $CH_2F_2$, $CH_3F$, $C_3H_2F_6$, and combinations thereof. When an inductively coupled high density plasma etch reactor is used, the flow rate of the hydrogen-containing fluorocarbon gas or gases is typically within the range of about 30 sccm and about 60 sccm. When $CH_2F_2$ (a highly preferred hydrogen-containing fluorocarbon gas) is used, the preferred flow rate is about 45 sccm.

Alternatively, the reactive gas comprises at least one fluorocarbon gas and hydrogen. The fluorocarbon gas is preferably selected from the group consisting of $C_2F_6$, $C_3F_6$, $C_3F_8$, $C_4F_6$, $C_4F_8$, and combinations thereof. When an inductively coupled high density plasma etch reactor is used, the flow rate of the fluorocarbon gas or gases is within the range of about 10 sccm and about 30 sccm, most preferably, about 20 sccm. The flow rate of hydrogen is between about 10 sccm and about 30 sccm, most preferably, about 20 sccm.

The nitrogen-comprising gas is preferably $N_2$. The addition of nitrogen to the plasma source gas improves the dissociation of oxygen and other gas species and also enhances residue removal. The presence of nitrogen can further suppress metal-comprising polymer growth and reduce or prevent the sidewall striation encountered when conventional post-etch treatments are used. When an inductively coupled high density plasma etch reactor is used, the flow rate of the nitrogen is typically within the range of about 10 sccm and about 20 sccm, most preferably, about 15 sccm.

When an inductively coupled high density plasma etch reactor is used, the post-etch treatment step 44 is typically performed using a source power within the range of about 2100 W and about 3100 W. A biased power within the range of about 150 W and about 300 W is typically applied during this step.

In a particularly preferred embodiment of the invention, when the Applied Materials' IPS oxide etch reactor is used, the post-etch treatment step is performed using an inner ring source power within the range of about 400 W and about 900 W, most preferably, about 650 W, and an outer ring source power within the range of about 1700 W and about 2200 W, most preferably, about 1950 W. A bias power within the range of about 150 W and about 300 W is typically applied. The process chamber pressure typically ranges between about 20 mTorr and 50 mTorr.

Figure 8:
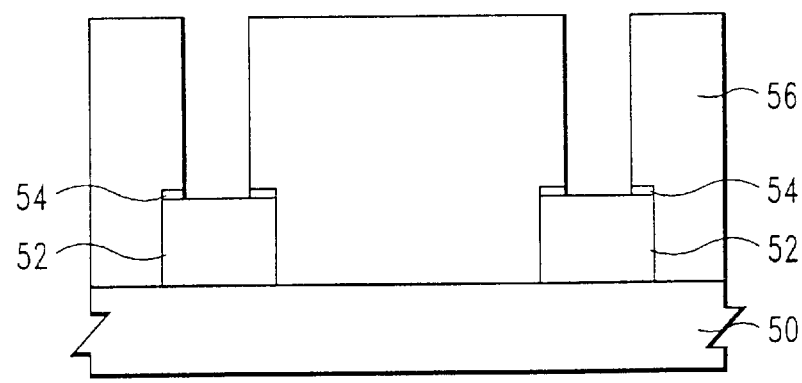
FIG. 8 is a cross-sectional view of the structure shown in FIG. 7, showing the etched contact via 60 after post-etch treatment according to the method of the present invention, and subsequent removal of the anti-reflection layer 54.

During the post-etch treatment step, the exposed portion of an anti-reflection layer 54, which typically comprises a metal-containing compound such as titanium nitride or an oxygen-containing compound such as silicon oxynitride, may be removed, with minimal loss of an underlying aluminum layer 52, as shown in FIG. 8. Referring to FIG. 7, during the post-etch treatment step, the remaining sidewall polymer and/or metal-comprising polymer 62 is attacked further by the carbon-fluorine radical, and reaction products of this attack, in combination with hydrogen species, form volatile components which can be removed cleanly. Any residual photoresist 58 remaining after the flushing step 42 may also be removed during the post-etch treatment step. Furthermore, the high chamber pressure utilized in the preferred embodiments assists in the removal of polymer deposits on the sidewalls and bottoms of the contact vias 60. The higher chamber pressure and the application of a bias power during this step allow a lower total gas flow and a longer residence time to be utilized, which further increases polymer-stripping efficiency.

Following the post-etch treatment step 44, a cleaning step 46 may be performed using a medium-flow oxygen-based plasma. When an inductively coupled high density plasma etch reactor is used, the flow rate of oxygen during this step is typically within the range of about 250 sccm and about 750 sccm, most preferably, about 500 sccm. The flow rate of oxygen used for the cleaning step is typically about 50% of the flow rate of oxygen used for the flushing step. Other oxygen-comprising gases can be utilized or added to the oxygen-based plasma. When an inductively coupled high density plasma etch reactor is used, cleaning step 46 is typically performed using a source power within the range of about 2500 W and about 3500 W, most preferably, about 3000 W.

In a particularly preferred embodiment of the invention, when the Applied Materials' IPS oxide etch reactor is used, the cleaning step is performed using an inner ring source power within the range of about 500 W and about 1000 W, most preferably, about 750 W, and an outer ring source power within the range of about 2000 W and about 2500 W, most preferably, about 250 W. No bias power is typically applied during the cleaning step. The process chamber pressure typically ranges between about 15 mTorr and 30 mTorr.

The cleaning step 46 assists in the removal of any gases remaining after the performance of prior steps from the reaction chamber using a medium-flow oxygen-based plasma, and providing a stabilized chamber condition for the performance of subsequent processes without the presence of undesired residual species.

If the optional flushing step 42 is not performed, the cleaning step 46 is preferably performed using a high-flow oxygen-based plasma. In this case, the flow rate of oxygen during the cleaning step is typically within the range of about 750 sccm and about 1250 sccm, most preferably, about 1000 sccm, in order to enhance the cleaning effect when the flushing step 42 is not used. The power conditions used in the performance of a high-flow oxygen-based plasma cleaning step are basically the same as described above for the medium-flow oxygen-based plasma cleaning step.

Throughout the post-etch treatment method of the present invention, the temperature of the substrate 50 (typically, a silicon wafer) can vary greatly under different processing recipes and applied powers. However, in order to avoid undesired reactions or damage to the semiconductor structure, the substrate temperature is preferably maintained at less than about 120° C. during the dielectric etch process, and less than about 80° C. during performance of the post-etch treatment method.

In order to remove the anti-reflection layer 54 underlying the contact vias 60, as shown in FIG. 8, an anti-reflection etch and second phase post-etch treatment are typically performed using methods known in the art following the completion of the post-etch treatment method of the invention.

The above-described preferred embodiments are not intended to limit the scope of the present invention, as one skilled in the art can, in view of the present disclosure expand such embodiments to correspond with the subject matter of the invention claimed below.

We claim:

1. A method for integrated post-etch treatment of a semiconductor structure following a dielectric etch process, wherein said semiconductor structure includes an overlying patterned photoresist layer, a dielectric layer through which openings have been etched underlying said patterned photoresist layer, an anti-reflection layer underlying said dielectric layer, and a conductive layer underlying said anti-reflection layer, wherein the method comprises exposing said semiconductor structure to a plasma generated from a source gas comprising about 38 to about 87 volume % of an oxygen-comprising gas, about 4 to about 22 volume % of a nitrogen-comprising gas, and about 10 to about 50 volume % of a reactive gas comprising hydrogen, carbon, and fluorine, whereby exposed photoresist layer and exposed anti-reflection layer are removed.

2. The method of claim 1, wherein said reactive gas comprises at least one hydrogen-containing fluorocarbon gas.

3. The method of claim 2, wherein said hydrogen-containing fluorocarbon gas is selected from the group consisting of $CHF_3$, $CH_2F_2$, $CH_3F$, $C_3H_2F_6$, and combinations thereof.

4. The method of claim 1, wherein said reactive gas comprises at least one fluorocarbon gas and hydrogen.

5. The method of claim 4, wherein said fluorocarbon gas is selected from the group consisting of $C_2F_6$, $C_3F_6$, $C_3F_8$, $C_4F_6$, $C_4F_8$, and combinations thereof.

6. The method of claim 1 or claim 2, or claim 4, wherein said nitrogen-comprising gas is $N_2$.

7. The method of claim 1, wherein said method further comprises a flushing step performed prior to said post-etch treatment.

8. The method of claim 7, wherein said flushing step comprises exposing said semiconductor structure to a high-flow plasma comprising oxygen.

9. The method of claim 1 or claim 8, wherein said method further comprises a cleaning step subsequent to said post-etch treatment.

10. The method of claim 9, wherein said cleaning step is performed while said semiconductor structure is present in said process chamber.

11. The method of claim 9, wherein said cleaning step is performed after said semiconductor structure is removed from said process chamber.

12. The method of claim 1, wherein said conductive layer comprises aluminum.

13. The method of claim 1, wherein said anti-reflection layer comprises titanium nitride.

14. The method of claim 1, wherein said oxygen-comprising gas is $O_2$.

15. A method of integrated post-etch treatment of a semiconductor structure following a dielectric etch process, wherein said semiconductor structure includes an overlying patterned photoresist layer, a dielectric layer through which openings have been etched underlying said patterned photoresist layer, an anti-reflection layer underlying said dielectric layer, and a conductive layer underlying said anti-reflection layer, wherein said method comprises the steps of:
   a) a flushing step comprising exposing said semiconductor structure to a high-flow plasma consisting essentially of at least one oxygen-comprising gas;
   b) a post-etch treatment step comprising exposing said semiconductor structure to a plasma generated from a source gas comprising oxygen, a nitrogen-comprising gas, and a reactive gas comprising hydrogen, carbon, and fluorine; and
   c) a cleaning step comprising exposing at least a process chamber in which said dielectric etch process was performed to a medium-flow plasma consisting essentially of at least one oxygen-comprising gas,
   whereby exposed photoresist material and exposed anti-reflection layer material are removed as a result of performing said method.

16. The method of claim 15, wherein said cleaning step is carried out with said semiconductor structure removed from said plasma reactor chamber.

17. The method of claim 15, wherein said at least one oxygen-comprising gas in steps (a) and (c) is $O_2$.

18. The method of claim 15, wherein said reactive gas comprises at least one hydrogen-containing fluorocarbon gas.

19. The method of claim 17, wherein said hydrogen-containing fluorocarbon gas is selected from the group consisting of $CHF_3$, $CH_2F_2$, $CH_3F$, $C_3H_2F_6$, and combinations thereof.

20. The method of claim 15, wherein said reactive gas comprises at least one fluorocarbon gas and hydrogen.

21. The method of claim 19, wherein said fluorocarbon gas is selected from the group consisting of $C_2F_6$, $C_3F_6$, $C_3F_8$, $C_4F_6$, $C_4F_8$, and combinations thereof.

22. The method of claim 14 or claim 17 or claim 19, wherein said nitrogen-comprising gas is $N_2$.

23. A method of integrated post-etch treatment of a semiconductor structure following a dielectric etch process, wherein said method is carried out in a plasma processing chamber which employs an inductively coupled power source for generation of plasma and a separate power source for biasing of said semiconductor structure, said method comprising:

a) a flushing step in which said semiconductor structure is exposed to a high-flow plasma comprising oxygen;

b) following said flushing step, performing a post-etch treatment step in which said semiconductor structure is exposed to a plasma generated from a source gas comprising oxygen, a nitrogen-comprising gas, and a reactive gas comprising hydrogen, carbon, and fluorine; and c) following said post-etch treatment step, performing a cleaning step in which said plasma processing chamber is exposed to a medium-flow plasma consisting essentially of at least one oxygen-comprising gas, whereby an exposed photoresist material and an exposed anti-reflection layer material are removed from said semiconductor structure and process chamber conditions are maintained.

24. The method of claim 23, wherein said semiconductor structure is removed prior to conducting the step c) cleaning step.

* * * * *